(12) United States Patent
Park

(10) Patent No.: US 7,956,450 B2
(45) Date of Patent: Jun. 7, 2011

(54) MULTI-CHIP PACKAGE

(75) Inventor: Bum Wook Park, Seoul (KR)

(73) Assignees: Bum Wook Park, Seoul (KR); Smart Modular Technologies, Fremont, CA (US)

( * ) Notice: Subject to any disclaimer, the term of this patent is extended or adjusted under 35 U.S.C. 154(b) by 50 days.

(21) Appl. No.: 12/416,339

(22) Filed: Apr. 1, 2009

(65) Prior Publication Data
US 2010/0084753 A1    Apr. 8, 2010

(30) Foreign Application Priority Data
Oct. 7, 2008    (KR) .................. 10-2008-0098218

(51) Int. Cl.
*H01L 23/02* (2006.01)
(52) U.S. Cl. .............. 257/686; 257/777; 438/109
(58) Field of Classification Search .............. 257/686, 257/777, E23.068; 438/109
See application file for complete search history.

(56) References Cited

U.S. PATENT DOCUMENTS
2003/0141583 A1 * 7/2003 Yang .................. 257/686

FOREIGN PATENT DOCUMENTS
| KR | 1020070082627 A | 8/2007 |
| KR | 1020080020376 A | 3/2008 |
| KR | 1020080020393 A | 3/2008 |

\* cited by examiner

*Primary Examiner* — Theresa T Doan
(74) *Attorney, Agent, or Firm* — Ladas & Parry LLP

(57) ABSTRACT

A multi-chip package is presented which includes a substrate, a lower semiconductor, an upper semiconductor chip, metal wires, an encapsulant, and mounting units. The substrate has electrode terminals on an upper surface and ball lands on a lower surface. The lower semiconductor chip is placed face-down on the substrate. The lower semiconductor chip has first bonding pads, first connectors and metal patterns. The upper semiconductor chip is placed face-down type on the back surface of the lower semiconductor chip. The upper semiconductor has second bonding pads and second connectors. The metal wires electrically the lower semiconductor chip to the substrate. The encapsulant seals the substrate, the lower semiconductor chip, the upper semiconductor chip and the metal wires. The mounting units are on the lower surface of the substrate.

11 Claims, 5 Drawing Sheets

MULTI-CHIP PACKAGE

CROSS-REFERENCE TO RELATED APPLICATIONS

The present application claims priority to Korean patent application number 10-2008-0098218 filed on Oct. 7, 2008, which is incorporated herein by reference in its entirety.

BACKGROUND OF THE INVENTION

The present invention relates to a semiconductor package, and more particularly, to a multi-chip package in which electrical and mechanical connections are formed between a substrate and a semiconductor chip and between semiconductor chips using bumps and metal patterns.

As is well known in the art, packaging technology has been developed to be capable of mounting an increased number of packages to a substrate having a limited size, that is, to decrease the size of packages. For instance, various types of chip size packages (hereinafter, referred to as "CSPs"), in which the size of semiconductor chips is greater than 80% of the overall size of packages, have been developed in the art. While not shown in a drawing, in these CSPs, because an increased number of packages can be mounted to a substrate having a limited size when compared to typical semiconductor packages. CSP advantages are provided in that it is possible to realize a product having a small size and high capacity.

However, while the CSPs provide advantages in that the number of packages to be mounted can be increased through the decrease in the size thereof, because one semiconductor chip is placed in one package, as is common in typical semiconductor packages, limitations necessarily exist in matching impedance to increase capacity and ensure high speed operation, and therefore, it is difficult to realize a system having high capacity.

Under these situations, in an effort to decrease the size of a package and increase the capacity of the package, research has actively been made to develop a stack package and a multi-chip package in which two or three semiconductor chips are placed in one package.

The multi-chip package is manufactured by placing at least two semiconductor chips having different functions or at least two semiconductor chips having the same function in one package. Generally, the multi-chip package is manufactured by packaging two to four semiconductor chips in the state in which they are simply arranged on a substrate or by packaging at least two semiconductor chips having different functions and sizes in the state in which they are vertically stacked.

Hereafter, a conventional multi-chip package will be briefly described with reference to FIG. 1.

Referring to FIG. 1, in a conventional multi-chip package 10, two semiconductor chips 12 and 14 are shown having different functions and sizes which are stacked in a face-up type on a substrate 11 which has electrode terminals 11a, by way of adhesives 13 and 15. Bonding pads 12a and 14a of the respective semiconductor chips 12 and 14 and the electrode terminals 11a of the substrate 11 are electrically connected by metal wires 16. The upper surface of the substrate 11, including the stacked semiconductor chips 12 and 14 and the metal wires 16, is molded by an encapsulant 17 such as an EMC (epoxy molding compound). Solder balls 18, as mounting units to external circuits, are attached to ball lands 11b that are placed on the lower surface of the substrate 11.

However, in the conventional multi-chip package as described above, when considering that the bonding pads of the respective semiconductor chips and the electrode terminals of the substrate are electrically connected with each other by the metal wires, a top cavity should be increased so as to prevent wire loops from being damaged. Due to this fact, a problem may arise in that the overall thickness of the package increases.

Also, in the case of placing center pad type semiconductor chips, since the metal wires serving as electrical connection units between the bonding pads and the electrode terminals form thin and long loops, protective coatings should be applied to the metal wires. Due to this fact, problems may arise in that the manufacturing cost and the number of processes increase, thermal characteristics deteriorate, and an operating speed decreases due to limitations in impedance matching.

In addition, in the conventional multi-chip package, due to the fact that electrical connections between the bonding pads of the respective stacked semiconductor chips and the electrode terminals of the substrate are formed by the metal wires, the metal wires connected with the lower semiconductor chip and the metal wires connected with the upper semiconductor chip are likely to be brought into contact with each other in a wire bonding process, as well as, in a subsequent molding process using the EMC. Thereby defects, such as short circuits, in the conventional multi-chip package can occur.

Further, because the conventional multi-chip package has a structure in which the semiconductor chips are stacked in the form of a step, limitations necessarily arise in selecting semiconductor chips to be stacked, as in the case that an upwardly positioned semiconductor chip should have a size capable of completely exposing the bonding pads of a downwardly positioned semiconductor chip.

SUMMARY OF THE INVENTION

Embodiments of the present invention are directed to a multi-chip package which can prevent or at least minimize the possibility that an entire thickness increases due to the presence of metal wires.

Also, embodiments of the present invention are directed to a multi-chip package which can solve or minimize the problems brought about by an impedance mismatch, thereby increasing the operating speed of a chip.

Further, embodiments of the present invention are directed to a multi-chip package that can minimize or prevent the number of processes and the manufacturing cost from increasing brought about by using metal wires.

In addition, embodiments of the present invention are directed to a multi-chip package that can minimize or prevent the occurrence of defects brought about by short circuits between metal wires.

Moreover, embodiments of the present invention are directed to a multi-chip package that can allow the sizes of semiconductor chips to be stacked to be freely selected.

In one aspect of the present invention, a multi-chip package comprises a substrate having circuit patterns that include electrode terminals placed on an upper surface of the substrate and ball lands placed on a lower surface of the substrate; a lower semiconductor chip placed in a face-down type on the substrate and having a plurality of first bonding pads on a front surface thereof; first connector formed on the first bonding pads and electrically and mechanically connecting the first bonding pads of the lower semiconductor chip and the electrode terminals of the substrate; a plurality of metal patterns formed to be arranged adjacent to edges of a back surface of the lower semiconductor chip; an upper semiconductor chip placed in a face-down type on the back surface of the lower semiconductor chip which includes the metal patterns, and having a plurality of second bonding pads on a frontal surface thereof; second connector formed on the second bonding pads and electrically and mechanically connecting the second bonding pads of the upper semiconductor chip and the metal patterns; metal wires electrically connecting the metal patterns and the electrode terminals of the substrate; an encapsulant sealing the upper surface of the substrate which includes the lower semiconductor chip, the upper semiconductor chip and the metal wires; and mounting units formed on the ball lands which are placed on the lower surface of the substrate.

The first and second connectors may comprise bump connectors or solder ball connectors.

The lower semiconductor chip and the upper semiconductor chip may have substantially the same size.

The lower semiconductor chip and the upper semiconductor chip may have different sizes.

The lower semiconductor chip and the upper semiconductor chip may comprise edge pad type semiconductor chips.

The lower semiconductor chip and the upper semiconductor chip may comprise center pad type semiconductor chips that have redistribution lines extending to edges thereof.

The multi-chip package further comprises UBMs (under-bump metal) formed on surfaces of the first and second bonding pads.

The multi-chip package further comprises a filler material in a space between the substrate and the lower semiconductor chip.

DESCRIPTION OF SPECIFIC EMBODIMENTS

Hereafter, specific embodiments of the present invention will be described in detail with reference to the accompanying drawings.

Figure 1:
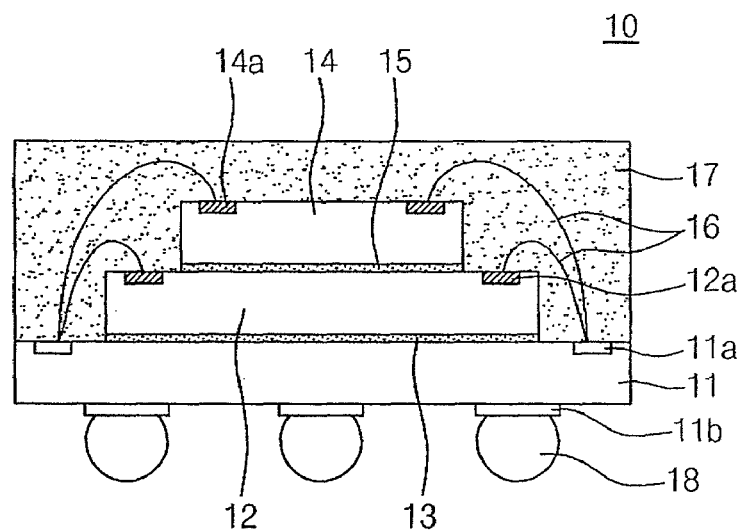
FIG. 1 is a sectional view illustrating a conventional multi-chip package.
Figure 2:
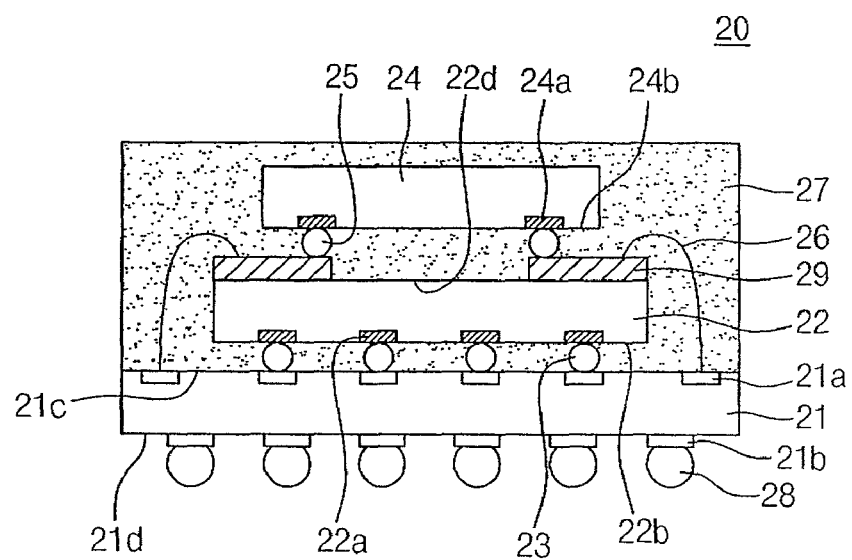
FIG. 2 is a sectional view illustrating a multi-chip package in accordance with one embodiment of the present invention.

FIG. 2 is a sectional view illustrating a multi-chip package in accordance with one embodiment of the present invention.

Referring to FIG. 2, at least two semiconductor chips, for example, two semiconductor chips 22 and 24, which include a lower semiconductor chip 22 and an upper semiconductor chip 24, that are stacked on a substrate 21. The substrate 21 may comprise, for example, a printed circuit board substrate. The substrate 21 may also have circuit patterns (not shown) that includes electrode terminals 21a placed on the upper surface 21c of the substrate 21 and ball lands 21b placed on the lower surface 21d of the substrate 21.

The lower semiconductor chip 22 has a plurality of first bonding pads 22a. The lower semiconductor chip 22 is placed on the substrate 21 in a face-down type such that its surface on which the first bonding pads 22a are formed faces the substrate 21. The lower semiconductor chip 22 is mechanically attached to the substrate 21 and is electrically connected with the electrode terminals 21a of the substrate 21 by first connectors 23 which are formed on the first bonding pads 22a. It is understood herein that the first connectors 23 may be any known type of first connectors such as those selected from the group consisting of solder ball first connectors 23 and bump first connectors 23.

A plurality of metal patterns 29 are attached adjacent to the edges of the back surface 22d of the lower semiconductor chip 22. As will be described later in detail, the metal patterns 29 serve as intermediate members for electrically connecting the upper semiconductor chip 24 and the electrode terminals 21a of the substrate 21. These metal patterns 29 are arranged at regular intervals adjacent to the edges of the back surface 22d of the lower semiconductor chip 22 while having the number corresponding to that of second bonding pads 24a of the upper semiconductor chip 24.

The upper semiconductor chip 24 has the plurality of second bonding pads 24a which are arranged adjacent to the edges of the frontal surface 24b of the upper semiconductor chip 24. The upper semiconductor chip 24 is placed in a face-down type on the back surface 22d of the lower semiconductor chip 22 including the metal patterns 29 such that its surface on which the second bonding pads 24a are formed faces the lower semiconductor chip 22. The upper semiconductor chip 24 is mechanically attached to the lower semiconductor chip 22 and is electrically connected with the metal patterns 29 by second connectors 25 which are formed on the second bonding pads 24a. The second bonding pads 24a of the upper semiconductor chip 24 and the metal patterns 29 are connected one-to-one with each other. It is understood herein that the second connectors 25 may be any type of second connectors 25 such as those selected from the group consisting of solder ball second connectors 25 and bump second connectors 25.

The metal patterns 29 that are connected with the second bonding pads 24a of the upper semiconductor chip 24 are electrically connected with the corresponding electrode terminals 21a of the substrate 21 by metal wires 26. As described above, the metal patterns 29 serve as intermediate members for electrically connecting the second bonding pads 24a of the upper semiconductor chip 24 and the electrode terminals 21a of the substrate 21.

As shown in FIG. 2, it can be appreciated that those electrode terminals 21a of the substrate 21, which are electrically connected with the metal patterns 29 by the metal wires 26, are placed outside the lower semiconductor chip 22. In particular, those electrode terminals 21a can be understood as being electrically connected with other electrode terminals 21a which are connected with the first bonding pads 22a of the lower semiconductor chip 22, via internal circuit patterns (not shown).

In order to prevent the lower semiconductor chip 22 and the upper semiconductor chip 24 from being compromised from the outside, the upper surface 21c of the substrate 21 including the stacked lower semiconductor chip 22 and upper semiconductor chip 24 and the metal wires 26 is molded using an encapsulant such as EMC. The mounting units 28 such as be solder ball mounting units 28 are attached to the ball lands 21b that are placed on the lower surface 21d of the substrate 21.

Since the multi-chip package 20 has a structure in which the lower semiconductor chip 22 and the upper semiconductor chip 24 are placed in a face-down type, then size limitations are not imposed by the sizes of semiconductor chips when they are stacked together.

The electrical connections of the multi-chip package 20 between the second bonding pads 24a of the upper semiconductor chip 24 and the electrode terminals 21a of the substrate 21 are formed by the metal wires 26. The electrical connections of the multi-chip package 20 between the first bonding pads 22a of the lower semiconductor chip 22 and the electrode terminals 21a of the substrate 21 are formed by the first connectors 23 without the use of metal wires. Therefore, the likelihood of contact between the metal wires connected with the first bonding pads of a lower semiconductor chip and the metal wires connected with the second bonding pads of an upper semiconductor chip in a conventional multi-chip package can be eliminated or at least minimized. Whereby it is possible to prevent or at least minimize the manufacturing yield from decreasing due to the occurrence of short circuits and impedance characteristics from deteriorating brought about by the presence of long metal wires.

Moreover, in the multi-chip package 20 according to one embodiment of the present invention, although the electrical connections between the second bonding pads 24a of the upper semiconductor chip 24 and the electrode terminals 21a of the substrate 21 are formed by using the metal wires 26, since they are formed by the medium of the metal patterns 29 which are formed adjacent to the edges of the back surface 22d of the lower semiconductor chip 22, then the length of wire loops can be decreased. Therefore, the characteristics of a package and the manufacturing yield can be improved and increased as compared to the conventional art.

Further, in the multi-chip package 20 according to one embodiment of the present invention, due to the nonuse of long metal wires, since it is not necessary to conduct a protective coating process for the metal wires, then this additional complexity of processing can be avoided. It is therefore possible to prevent or at least minimize the manufacturing cost from increasing and the manufacturing yield from decreasing.

In addition, in the multi-chip package 20 according to one embodiment of the present invention, because the lower semiconductor chip 22 and the upper semiconductor chip 24 are directly flip-chip bonded using the first and second connectors 23 and 25 without using adhesive tapes or adhesive films, the manufacturing cost can be decreased due to the nonuse of separate bonding materials.

FIGS. 3a through 3e are sectional views illustrating the processes of a method for manufacturing the multi-chip package in accordance with one embodiment of the present invention. The method will be described below.

Figure 3A:
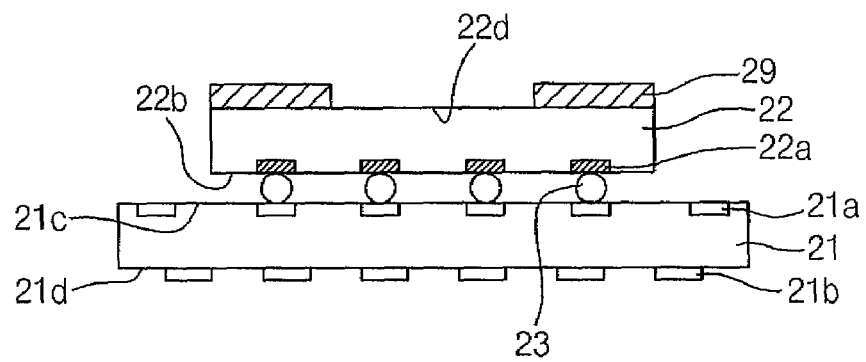
FIGS. 3a through 3e are sectional views illustrating the processes of a method for manufacturing the multi-chip package in accordance with one embodiment of the present invention.

Referring to FIG. 3a, a first semiconductor chip, that is, a lower semiconductor chip 22, which has a plurality of first bonding pads 22a formed of aluminum on the front surface 22b thereof, is prepared. In this state, first connectors 23 are formed on the respective first bonding pads 22a of the lower semiconductor chip 22.

The lower semiconductor chip 22 is an edge pad type in which the first bonding pads 22a are arranged adjacent to the edges of the front surface 22b of the lower semiconductor chip 22. Alternatively, the lower semiconductor chip 22 may be a center pad type in which the first bonding pads 22a are arranged on the center portion of the front surface 22b of the lower semiconductor chip 22. In the case where the lower semiconductor chip 22 is not the edge pad type but the center pad type, the first bonding pads 22a arranged on the center portion can be extended to the edges by way of redistribution lines which are formed through a redistribution process. Also, in the first bonding pads 22a of the lower semiconductor chip 22, portions to which the connectors are to be attached can correspond to as or be different from portions which are to be connected to the electrode terminals 21a of the substrate 21, depending upon the size of the chip and the orientation of the pads.

It is understood that the first connectors 23 may be composed of any type of first connectors 23 such as those selected from the group consisting of solder ball first connectors 23 and bump first connectors 23. In the case of solder ball first connectors 23 can be formed by adopting a ball attachment method.

Further, it is conceivable that a UBM (under-bump metal) can be formed on the surfaces of the first bonding pads 22a so that the adhesion force between the first bonding pads 22a and the first connectors 23 can be increased, The UBM can be formed by depositing a metal layer using evaporation or sputtering and by patterning the metal layer using a polymer. The patterning of the metal layer using a polymer is implemented in a manner such that, after applying a liquid polymer, the liquid polymer is patterned via a lithography process or is dried using a dry film.

It is preferred that the UBM is formed to have a three-layered structure including an adhesive layer, a diffusion barrier layer and a wetting layer. At least one of these layers can be used to constitute the UBM depending upon the material of the UBM. The adhesive layer may be formed of Al, Ti or Cr. Before depositing the adhesive layer, in order to increase adhesion force, gas etching using a gas such as Ar or plasma cleaning can be conducted for the surfaces of the first bonding pads 22a to the extent of not causing damage thereto. The diffusion barrier layer functions to prevent a metal such as solder having excellent diffusion capability from diffusing excessively and is formed of Ni or similar materials. The wetting layer is formed of Au, Cu, Pd or similar materials which have excellent wettability with respect to the material of the connectors.

It is preferred that the first connectors 23 be formed of a material, such as solder, nickel, gold, and mixtures thereof, capable of stably forming electrical and mechanical connections between the first bonding pads 22a made of aluminum and the electrode terminals 21a of the substrate 21. The first connectors 23 can be formed via techniques such as, evaporation, electroplating, electroless plating, stencil printing, jet printing, or a pick and place method.

In succession, after depositing a metal layer on the back surface 22d of the lower semiconductor chip 22, by patterning the metal layer, a plurality of metal patterns 29 are formed to be arranged adjacent to the edges of the back surface 22d of the lower semiconductor chip 22. As will be described later in detail, the metal patterns 29 are formed to electrically connect the electrode terminals 21a of the substrate 21 and second bonding pads 24a of an upper semiconductor chip 24.

The lower semiconductor chip 22, that has the plurality of metal patterns 29 formed adjacent to the edges of the back surface 22d thereof, is flip-chip bonded in a face-down type to the substrate 21. The substrate 21, which has circuit patterns (not shown), can include the electrode terminals 21a placed on the upper surface 21c thereof and ball lands 21b placed on the lower surface 21d thereof, by the first connectors 23 which are formed on the first bonding pads 22a of the lower semiconductor chip 22.

Figure 3B:
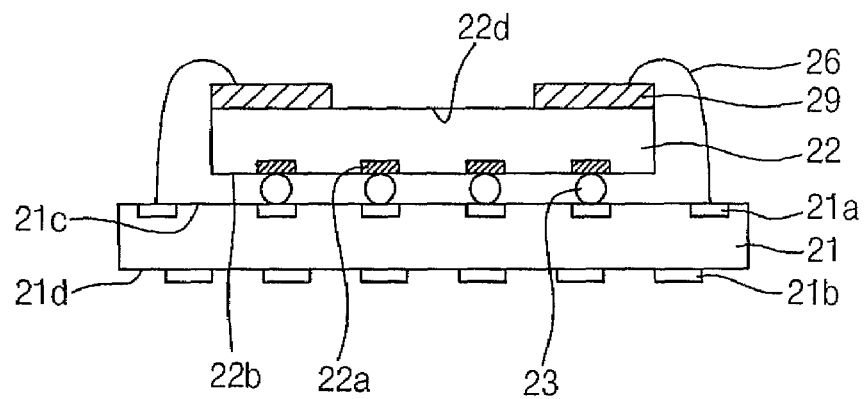

Referring to FIG. 3b, the metal patterns 29 and the electrode terminals 21a of the substrate 21 are connected by metal wires 26 using a wire bonding process. At this instance, the wire bonding process may be conducted as reverse bonding from the electrode terminals 21a of the substrate 21 to the metal patterns 29. In this manner, primary bonding is implemented for the electrode terminals 21a of the substrate 21, and then, secondary bonding is implemented for the metal patterns 29 such that the electrode terminals 21a and the metal patterns 29 are connected by the metal wires 26.

Here, since the metal wires 26 connect the metal patterns 29, which are connected with second bonding pads 24a of an upper semiconductor chip 24, with the electrode terminals 21a of the substrate 21, then wire loops are not needed to be substantial in size. Specifically, because the metal wires 26 are placed below the upper semiconductor chip 24, they do not exert any substantial influence on the overall thickness of the package.

Figure 3C:
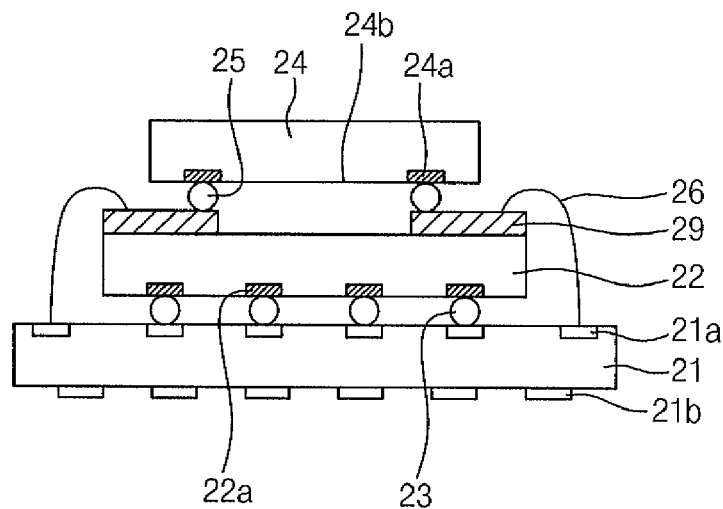

Referring to FIG. 3c, the upper semiconductor chip 24 is shown having the plurality of second bonding pads 24a formed of Al on the frontal surface 24b thereof, is prepared. In this state, second connectors 25 are formed on the respective second bonding pads 24a of the upper semiconductor chip 24.

Here, similar to the lower semiconductor chip 22, the upper semiconductor chip 24 can be an edge pad type in which the second bonding pads 24a are arranged adjacent to the edges of the frontal surface 24b of the upper semiconductor chip 24 or a center pad type in which the second bonding pads 24a are arranged on the center portion of the frontal surface 24b of the upper semiconductor chip 24. In the case where the upper semiconductor chip 24 is the center pad type, the second bonding pads 24a arranged on the center portion can be extended to the edges by way of redistribution lines. It is understood that the second connectors 25 may be formed of any type of second connectors such as those selected from the group consisting of bump second connectors 25 and solder ball connectors 25. In the case of solder ball second connectors 25, they can be formed by adopting a ball attachment method.

Further, it is conceivable that a UBM can be formed on the surfaces of the second bonding pads 24a. Similar to the UBM formed on the first bonding pads 22a, it is preferred that the UBM is formed to have a three-layered structure including an adhesive layer, a diffusion barrier layer and a wetting layer. At least one of these layers can be used to constitute the UBM depending upon the material of the UBM. The adhesive layer, the diffusion barrier layer and the wetting layer can be formed of the same materials as those of the aforementioned UBM.

It is preferred that the second connectors 25 be formed of a material, such as solder, nickel, gold, and mixtures thereof, capable of stably forming electrical and mechanical connections between the second bonding pads 24a made of Al and the metal patterns 29 of the lower semiconductor chip 22. The second connectors 25 can be formed through evaporation, electroplating, electroless plating, stencil printing, jet printing, or a pick and place method.

In succession, the upper semiconductor chip 24 is flip-chip bonded in a face-down type to the lower semiconductor chip 22, which includes the metal patterns 29, by the second connectors 25 which are formed on the second bonding pads 24a of the upper semiconductor chip 24. At this time, the second bonding pads 24a of the upper semiconductor chip 24 are mechanically and electrically coupled to portions of the metal patterns 29 via the second connectors 25.

Since the upper semiconductor chip 24 is bonded in a face-down type to the lower semiconductor chip 22 by the second connectors 25, the size of the upper semiconductor chip 24 is not specifically limited.

Figure 3D:
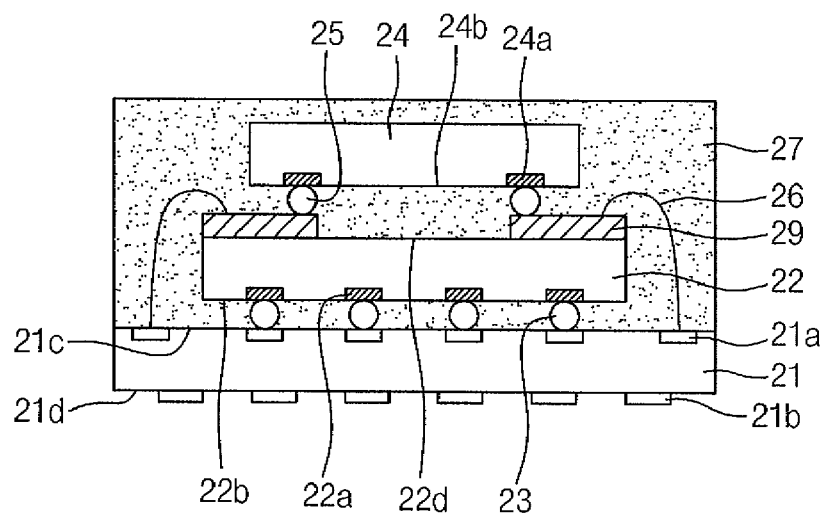

Referring to FIG. 3d, in order to prevent the lower semiconductor chip 22 and the upper semiconductor chip 24 from being physically influenced from the outside, the upper surface 21c of the substrate 21 including the lower semiconductor chip 22, the upper semiconductor chip 24 and the metal wires 26 are molded using an encapsulant 27 such as an EMC.

Figure 3E:
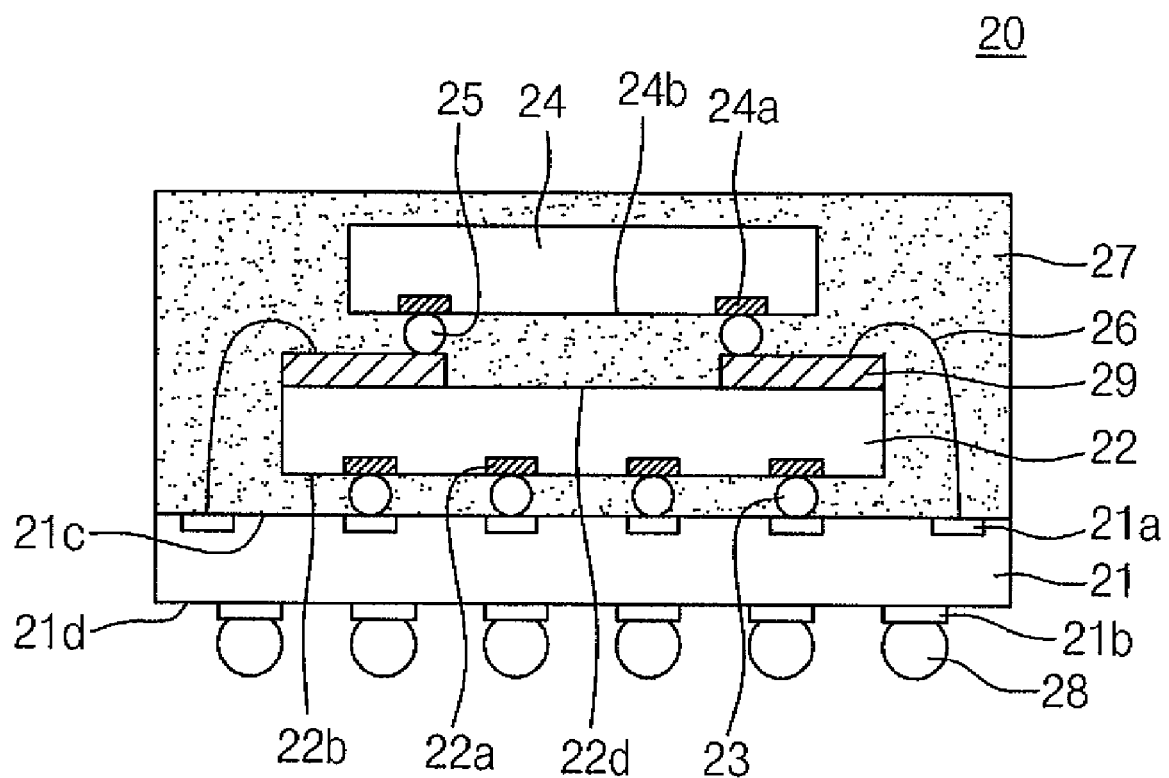

Referring to FIG. 3e, solder balls 28 as mounting units to external circuits are attached to the ball lands 21b which are placed on the lower surface 21d of the substrate 21. As a result, the manufacture of the multi-chip package 20 in accordance with one embodiment of the present invention is completed.

Figure 4:
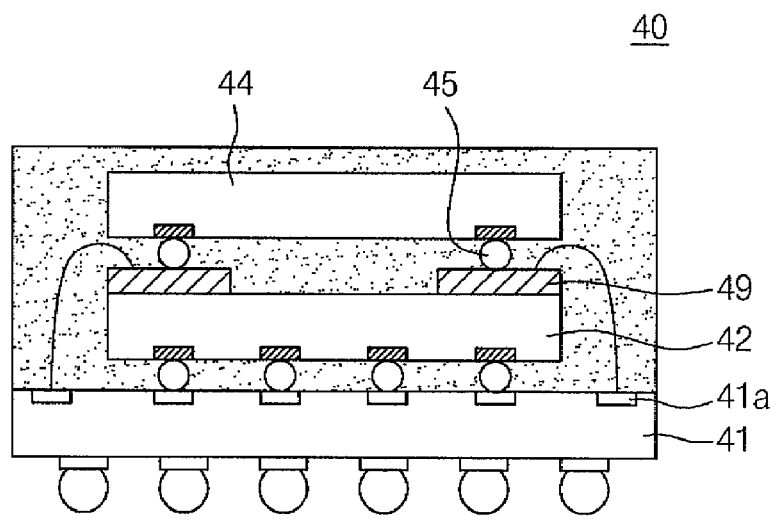
FIG. 4 is a sectional view illustrating a multi-chip package in accordance with another embodiment of the present invention.

FIG. 4 is a sectional view illustrating a multi-chip package in accordance with another embodiment of the present invention.

Referring to FIG. 4, in a multi-chip package 40 in accordance with another embodiment of the present invention, two semiconductor chips 42 and 44 having the same size are stacked upon each other. That is to say, in the multi-chip package 40 in accordance with another embodiment of the present invention, a lower semiconductor chip 42 and an upper semiconductor chip 44 have substantially the same size and are vertically stacked on a substrate 41.

Similar to the multi-chip package according to the aforementioned embodiment, in the multi-chip package 40 in accordance with another embodiment of the present invention, since the upper semiconductor chip 44 is flip-chip bonded to the lower semiconductor chip 42 by second connectors 45 and is connected with electrode terminals 41a of the substrate 41 through metal patterns 49, limitations are not imposed by the sizes of semiconductor chips to be stacked.

The multi-chip package 40 in accordance with the present embodiment has the same construction as that according to the aforementioned embodiment except that the two semiconductor chips having the same size are stacked upon each other, and therefore, repeated description thereof will be omitted herein.

Figure 5:
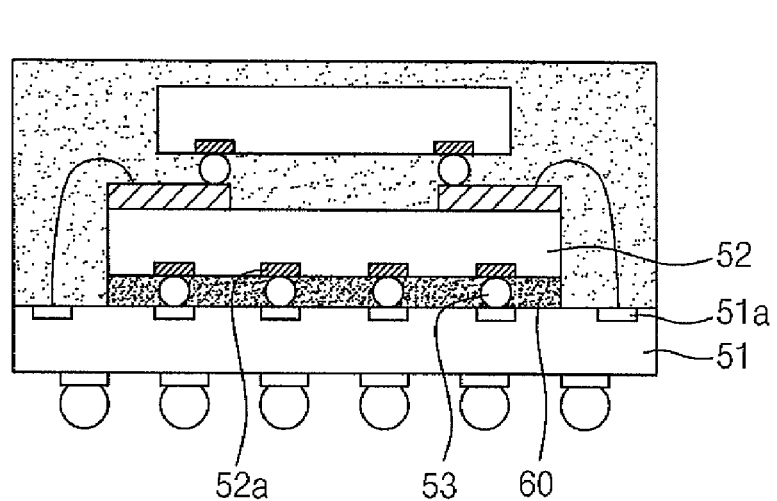
FIG. 5 is a sectional view illustrating a multi-chip package in accordance with still another embodiment of the present invention.

FIG. 5 is a sectional view illustrating a multi-chip package in accordance with still another embodiment of the present invention.

Referring to FIG. 5, in a multi-chip package 50 in accordance with still another embodiment of the present invention, the space defined between a lower semiconductor chip 52 and a substrate 51, which are flip-chip bonded to each other by first connectors 53, is under-filled with a filler material 60. According to this fact, in the multi-chip package 50 in accordance with still another embodiment of the present invention, the reliability of solder joints between first bonding pads 52a of the lower semiconductor chip 52 and electrode terminals 51a of the substrate 51 can be ensured.

The multi-chip package 50 in accordance with the present embodiment has the same construction as that according to one embodiment except that the filler material 60 is underfilled in the space defined between the lower semiconductor chip 52 and the substrate 51, and therefore, repeated description thereof will be omitted herein.

Meanwhile, although not shown in the drawing, in a still further embodiment of the present invention, three or more semiconductor chips can be stacked. Even in this case, since the size of wire loops is not needed to be increased, inconvenience during processes can be avoided, the manufacturing cost can be decreased, and the manufacturing yield can be increased.

As is apparent from the above description, in the present invention, because a lower chip and an upper chip are stacked using connectors, the sizes of the chips to be stacked are not specifically limited.

Also, in the present invention, since only the metal patterns connected to the bonding pads of the upper chip and the electrode terminals of a substrate are connected with each other using metal wires, then it is possible to prevent short circuits from being formed between the metal wires, whereby the manufacturing yield and the reliability of a multi-chip package can be increased and improved.

In addition, in the present invention, due to the fact that electrical connections are formed between the upper chip and the electrode terminals of the substrate via the metal patterns, the size of wire loops can be decreased. Accordingly, the entire thickness of the multi-chip package can be significantly decreased when compared to the conventional art, whereby it is possible to realize a thin multi-chip package.

Further, in the present invention, since it is not necessary to form thin and long wire loops, it is possible to prevent the number of processes and the manufacturing cost from increasing due to the application of a wire protection coating. Thereby it is possible to prevent an operating speed from decreasing due to the deterioration of thermal characteristics and impedance mismatch.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A multi-chip package comprising:
    a substrate including:
        electrode terminals on an upper surface of the substrate, and
        ball lands on a lower surface of the substrate;
    a lower semiconductor chip placed face-down on the substrate, the lower semiconductor chip including:
        first bonding pads on a front surface, and
        first connectors electrically and mechanically connecting together the first bonding pads of the lower semiconductor chip to the electrode terminals of the substrate; and
        metal patterns on a back surface of the lower semiconductor chip;
    an upper semiconductor chip placed face-down type on the back surface of the lower semiconductor chip, the upper semiconductor including:
        second bonding pads on a frontal surface of the upper semiconductor, and
        second connectors electrically and mechanically connecting the second bonding pads of the upper semiconductor chip and the metal patterns;
    metal wires electrically connecting together the metal patterns of the lower semiconductor chip and the electrode terminals of the substrate;
    an encapsulant sealing the upper surface of the substrate, the lower semiconductor chip, the upper semiconductor chip and the metal wires; and
    mounting units on the ball lands which are on the lower surface of the substrate wherein the first and second bonding pads each comprise an adhesive layer, a diffusion barrier layer and a wetting layer.

2. The multi-chip package according to claim 1, wherein the first connectors comprise bump first connectors or solder ball first connectors.

3. The multi-chip package according to claim 1, wherein the lower semiconductor chip and the upper semiconductor chip have substantially the same size.

4. The multi-chip package according to claim 1, wherein the lower semiconductor chip and the upper semiconductor chip have different sizes.

5. The multi-chip package according to claim 1, wherein the lower semiconductor chip and the upper semiconductor chip are edge pad type semiconductor chips.

6. The multi-chip package according to claim 1, wherein the lower semiconductor chip and the upper semiconductor chip are center pad type semiconductor chips.

7. The multi-chip package according to claim 1, wherein the second connectors comprise bump second connectors or solder ball second connectors.

8. The multi-chip package according to claim 1, further comprises a filler material between the substrate and the lower semiconductor chip.

9. The multi-chip package according to claim 1, wherein the adhesive layer is formed of Al, Ti or Cr.

10. The multi-chip package according to claim 1, wherein the diffusion barrier layer is formed of Ni.

11. The multi-chip package according to claim 1, wherein the wetting layer is formed of Au, Cu, or Pd.

* * * * *